(12) United States Patent
Wang et al.

(10) Patent No.: US 11,197,385 B2
(45) Date of Patent: Dec. 7, 2021

(54) EXPANSION CARD HOLDER AND HOOK FIXING MECHANISM

(71) Applicant: HONGFUJIN PRECISION ELECTRONICS(TIANJIN)CO., LTD., Tianjin (CN)

(72) Inventors: Wen-Chen Wang, New Taipei (TW); Jia-Feng Lin, New Taipei (TW); Chieh-Hsiang Lin, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/895,148

(22) Filed: Jun. 8, 2020

(65) Prior Publication Data
US 2021/0345507 A1 Nov. 4, 2021

(30) Foreign Application Priority Data

Apr. 30, 2020 (CN) .......................... 202010363788.8

(51) Int. Cl.
*H05K 7/14* (2006.01)
*G06F 1/18* (2006.01)

(52) U.S. Cl.
CPC ........... *H05K 7/1405* (2013.01); *G06F 1/185* (2013.01); *G06F 1/186* (2013.01); *H05K 7/1417* (2013.01)

(58) Field of Classification Search
CPC ....... G06F 1/185; G06F 1/186; H05K 7/1417; H05K 7/1405; H05K 7/1409
See application file for complete search history.

(56) References Cited

U.S. PATENT DOCUMENTS 8,534,777 B2 9/2013 Gong et al.
9,107,321 B2 * 8/2015 Yin ...................... H05K 7/1489

FOREIGN PATENT DOCUMENTS

TW I528886 B 4/2016

* cited by examiner

*Primary Examiner* — James Wu
(74) *Attorney, Agent, or Firm* — ScienBiziP, P.C.

(57) ABSTRACT

A hook fixing mechanism includes a fixing frame, a first hook, and a second hook. The first hook is rotationally mounted on the fixing frame. A first end of the first hook protrudes from the fixing frame, and a second end of the first hook is movably snapped on the fixing frame. The second hook is rotationally mounted on the fixing frame. A third end of the second hook protrudes from the fixing frame, and a fourth end of the second hook resists against the first hook.

17 Claims, 6 Drawing Sheets

EXPANSION CARD HOLDER AND HOOK FIXING MECHANISM

FIELD

The subject matter herein generally relates to expansion card holders, and more particularly to an expansion card holder including a hook fixing mechanism.

BACKGROUND

Generally, one side of an expansion card is fixed in a mounting frame. When a connector is docked with the expansion card in the mounting frame, an opposite side of the expansion card may be tilted forward, which affects signal transmission between the connector and the expansion card.

BRIEF DESCRIPTION OF THE DRAWINGS

Implementations of the present disclosure will now be described, by way of embodiments, with reference to the attached figures.

DETAILED DESCRIPTION

Figure 1:
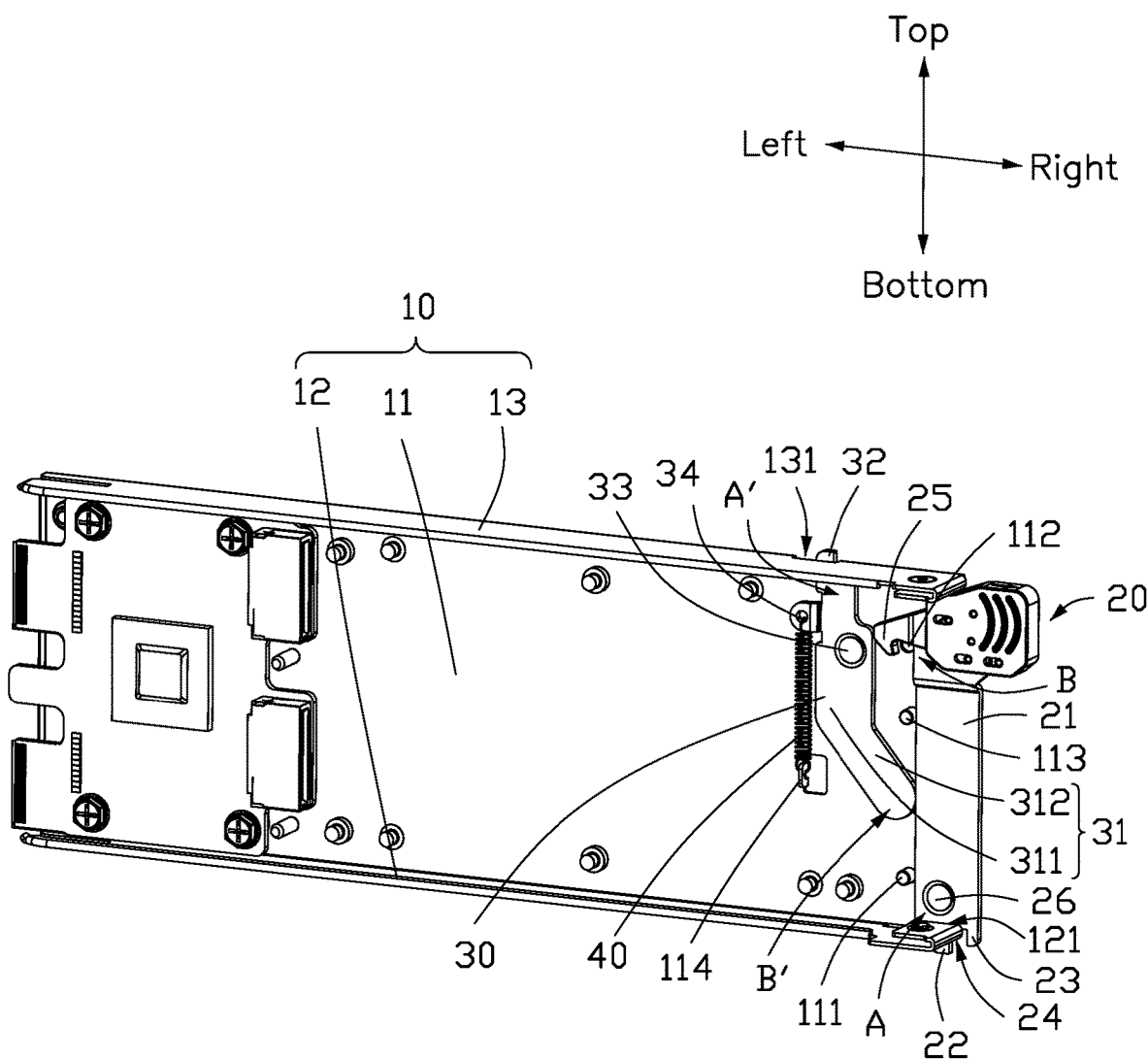
FIG. 1 is an isometric view of an embodiment of a hook fixing mechanism.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows an embodiment of a hook fixing mechanism 1 used for fixing an expansion card on a mounting frame. The hook fixing mechanism 1 includes a fixing frame 10, a first hook 20, and a second hook 30. The first hook 20 is rotationally mounted on the fixing frame 10. A first end A of the first hook 20 protrudes from the fixing frame 10, and a second end B of the first hook 20 is movably snapped on the fixing frame 10. The second hook 30 is rotationally mounted on the fixing frame 10. A third end A' of the second hook 30 protrudes from the fixing frame 10, and a fourth end B' of the second hook 30 resists the first hook 20.

The fixing frame 10 includes a fixing plate 11, a first fixing side plate 12, and a second fixing side plate 13. The fixing plate 11 is substantially a rectangular parallelepiped plate. The first fixing side plate 12 and the second fixing side plate 13 are provided on opposite side edges of the fixing plate 11, and the first fixing side plate 12 and the second fixing side plate 13 are substantially perpendicular to the fixing plate 11. The fixing plate 11, the first fixing side plate 12, and the second fixing side plate 13 cooperatively define a receiving space for receiving an expansion card. The first hook 20 and the second hook 30 are located at an end of the fixing plate 11.

The fixing plate 11, the first fixing side plate 12, and the second fixing side plate 13 may be integrally formed. A shape of the fixing frame 10 may be set as the same as a shape of an outline of the expansion card, so that the fixing frame 10 can be applied to different expansion cards, and versatility of the hook fixing mechanism 1 is increased.

The fixing plate 11 is provided with a first positioning post 111, a second positioning post 112, and a third positioning post 113 on a same side of the fixing plate 11 facing the expansion card. The first positioning post 111 is located on a side of the first end A to limit rotation of the first end A. The second positioning post 112 cooperates with the first hook 20, and the second end B of the first hook 20 is movably snapped on the second positioning post 112. The third positioning post 113 is located on a side of the second hook 30 to limit rotation of the second hook 30.

Figure 2:
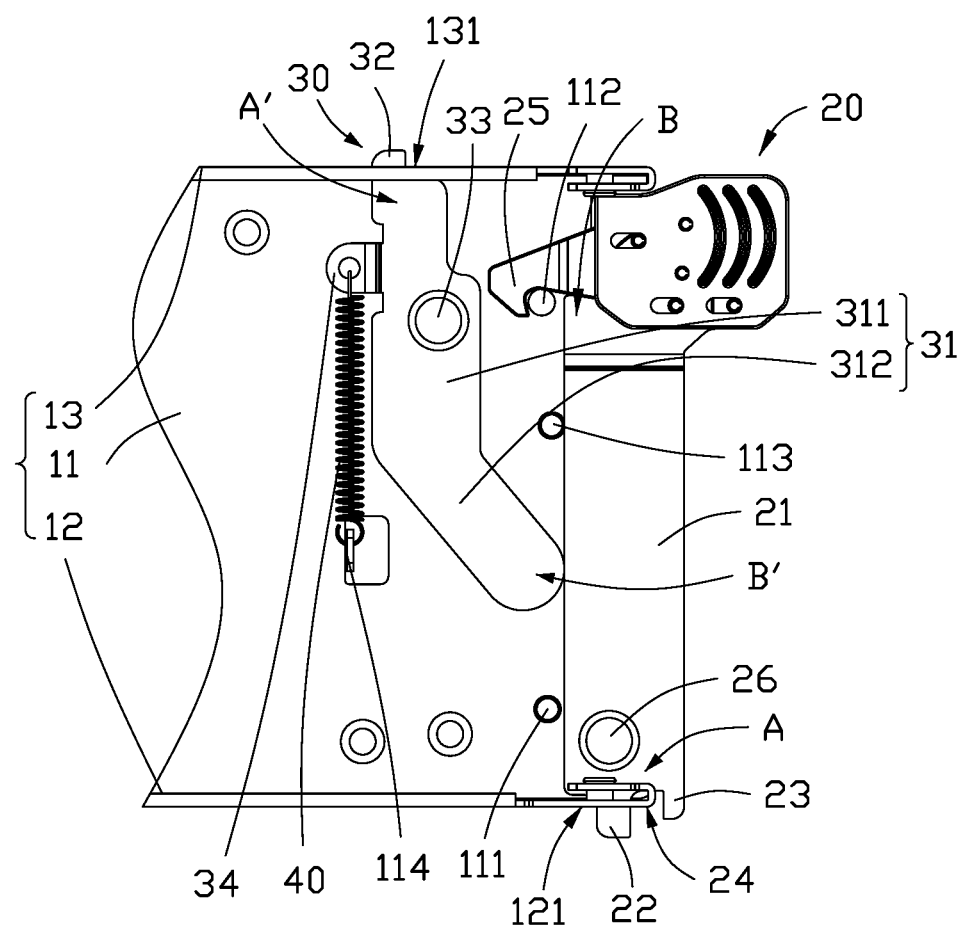
FIG. 2 is a schematic front view of the hook fixing mechanism.

Referring to FIG. 1 and FIG. 2, the first fixing side plate 12 defines a first through hole 121 adjacent to a right end, and a portion of the first end A of the first hook 20 may protrude through the first through hole 121.

The second fixing side plate 13 defines a second through hole 131 adjacent to the right end, and a portion of the third end A' of the second hook 30 may protrude through the second through hole 131.

Referring to FIG. 2, the first hook 20 includes a first connecting portion 21. The first end A and the second end B are opposite ends of the first connecting portion 21. The first connecting portion 21 is substantially parallel to the fixing plate 11. The first hook 20 further includes a first resisting portion 22, a second resisting portion 23, and a hook portion 25. The first resisting portion 22 and the second resisting portion 23 are located adjacent to the first end A, and the hook portion 25 is located adjacent to the second end B. In one embodiment, a portion of the first connecting portion 21 and a portion of the hook portion 25 are located outside the fixing frame 10, so that the hook portion 25 can be conveniently operated. Only a portion of the hook portion 25 may be located outside the fixing frame 10 to better protect the first connecting portion 21.

Specifically, the first resisting portion 22 and the second resisting portion 23 are located at an end of the first connecting portion 21, and a groove 24 is defined between the first resisting portion 22 and the second resisting portion 23. The first resisting portion 22 protrudes from the first fixing side plate 12 through the first through hole 121, and the second resisting portion 23 is located outside the first fixing side plate 12. A portion of the first fixing side plate 12 is located in the groove 24. The groove 24 is defined between the first resisting portion 22 and the second resisting portion 23, and the first end A of the first hook 20 is fastened in the first through hole 121 of the first fixing side plate 12.

The first connecting portion 21, the first resisting portion 22, and the second resisting portion 23 may be integrally formed. When the first connecting portion 21 is formed, the groove 24 is defined at a position of the first end A.

The hook portion 25 and the first connecting portion 21 are substantially perpendicular to each other. Further, the hook portion 25 is movably snapped on the second positioning post 112 to fix the first hook 20 relative to the fixing frame 10. By operating the hook portion 25, the hook portion 25 can be detached from the second positioning post 112.

In order to enable the hook portion 25 to disengage from the second positioning post 112, the hook portion 25 may be offset relative to the first connecting portion 21, so that the hook portion 25 can smoothly detach from the second positioning post 112.

The first hook 20 includes a first rotating shaft 26 located substantially at the first end A. The first rotating shaft 26 is fixed to the first connecting portion 21 and the fixing plate 11 so that the first connecting portion 21 can rotate relative to the fixing plate 11.

The first positioning post 111 is located on the side of the first connecting portion 21 adjacent to the first end A. When the hook portion 25 disengages from the second positioning post 112, the first connecting portion 21 rotates, and the first positioning post 111 resists an edge of the first end A to prevent the first hook 20 from continuing to rotate, thereby preventing the first connecting portion 21 from falling off the fixing frame 10.

Rotation of the first connecting portion 21 drives rotation of the first resisting portion 22 and the second resisting portion 23. The first resisting portion 22 and the second resisting portion 23 rotate around a portion of the first fixing side plate 12 located in the groove 24. In other embodiments, if the length of the first resisting portion 22 and the second resisting portion 23 is greater than the diameter of the first through hole 121, then the first resisting portion 22 and the second resisting portion 23 can directly resist the first fixing side plate 12, and the first positioning post 111 can be omitted.

Referring to FIG. 2, the second hook 30 is located on the left side of the first hook 20. The second hook 30 includes a second connecting portion 31, and the third end A' and the fourth end B' are two ends of the second connecting portion 31. The second connecting portion 31 is substantially parallel to the fixing plate 11. The second hook 30 further includes a third resisting portion 32 provided at the third end A'.

Specifically, the second connecting portion 31 includes a first straight section 311 and a second straight section 312 connected to the first straight section 311. An angle between the first straight section 311 and the second straight section 312 is an obtuse angle. The third end A' is an end of the first straight section 311, and the fourth end B' is an end of the second straight section 312.

The third resisting portion 32 is located at an end of the first straight section 311. The third resisting portion 32 protrudes from the second fixing side plate 13 through the second through hole 131.

An end of the second straight section 312 resists the first hook 20. The fourth end B' resists the first connecting portion 21.

The first straight section 311, the second straight section 312, and the third resisting portion 32 may be integrally formed.

The second hook 30 includes a second rotating shaft 33. The second rotating shaft 33 is fixed on the first straight section 311 and the fixing plate 11, so that the second connecting portion 31 can rotate relative to the fixing plate 11.

The third positioning post 113 is disposed between the first hook 20 and the second hook 30 between the first straight section 311 and the second straight section 312. When the second connecting portion 31 rotates, the third positioning post 113 resists the second connecting portion 31 to limit rotation of the second connecting portion 31, so that the second connecting portion 31 returns to resist the first hook 20.

The hook fixing mechanism 1 further includes a resilient member 40. Two ends of the resilient member 40 are respectively connected to the fixing frame 10 and the second hook 30. When the second end B disengages from the fixing frame 10, the first hook 20 rotates, and a restoring force of the resilient member 40 drives the second hook 30 to rotate.

In one embodiment, the resilient member 40 is a spring. In other embodiments, the resilient member 40 can be other structures having equivalent functions or effects.

A first fixing portion 114 is provided on the fixing plate 11, and a second fixing portion 34 is provided on a side of the second hook 30. The second fixing portion 34 is located adjacent to the third end A' on the left side of the third end A', and the first fixing portion 114 is located on a lower end of the second fixing portion 34. Both ends of the resilient member 40 are respectively connected to the first fixing portion 114 and the second fixing portion 34. When the hook portion 25 is hooked on the second positioning post 112, the resilient member 40 is in a stretched state. After the hook portion 25 is detached from the second positioning post 112, the restoring force of the resilient member 40 drives the second hook 30 to rotate. In this way, when the first hook 20 is operated, the second hook 30 generates a corresponding action change.

In other embodiments, the first fixing portion 114 may be integrally formed with the fixing frame 10, and the second fixing portion 34 may be integrally formed with the second connecting portion 31.

Referring to FIG. 2, when the hook portion 25 is hooked on the second positioning post 112, the first resisting portion 22 and the second resisting portion 23 are substantially perpendicular to the first fixing side plate 12, the third resisting portion 32 is substantially perpendicular to the second fixing side plate 13, the fourth end B' of the second hook 30 resists against the first connecting portion 21, and the resilient member 40 is in the stretched state.

Figure 3:
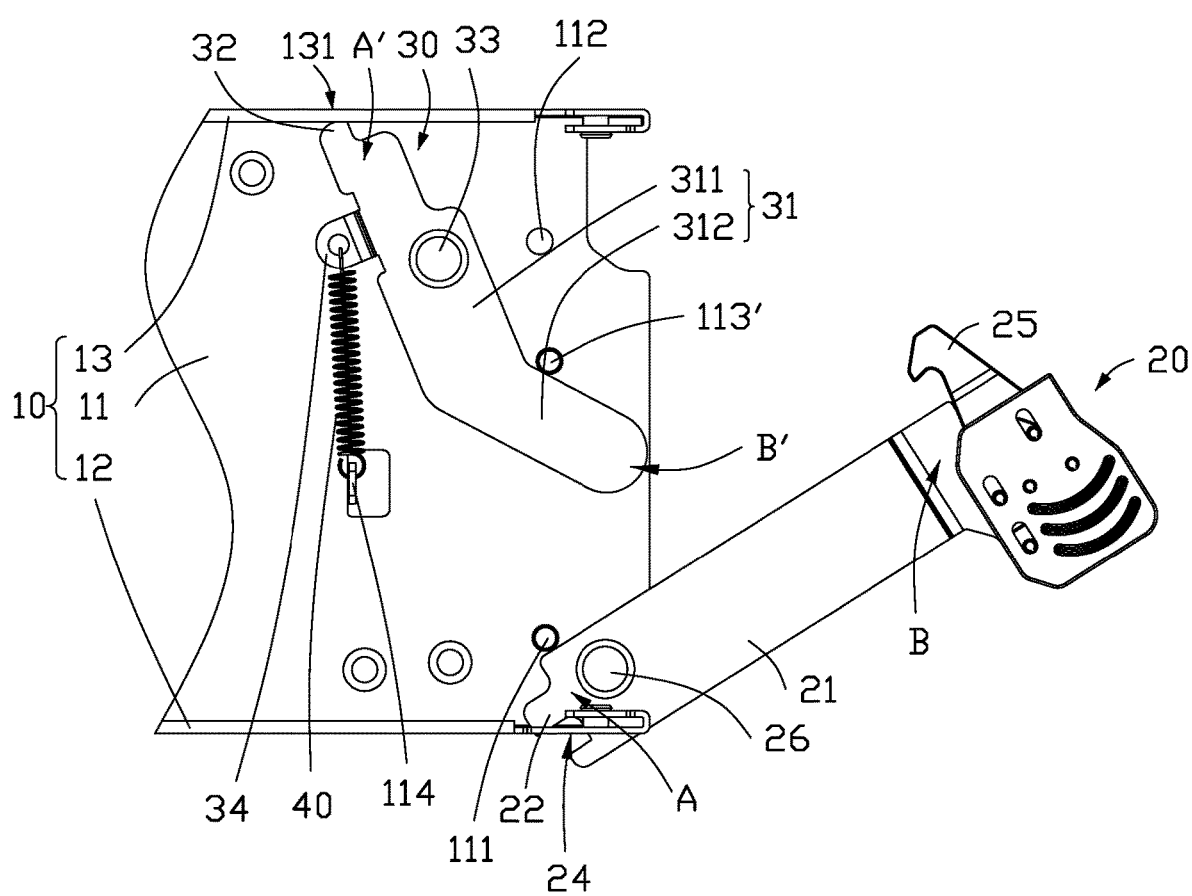
FIG. 3 is a schematic diagram showing rotation of a first hook and a second hook of the hook fixing mechanism.

Referring to FIG. 3, when the hook portion 25 is operated to disengage the hook portion 25 from the second positioning post 112, the first connecting portion 21 rotates clockwise around the first rotating shaft 26, and the first resisting portion 22 and the second resisting portion 23 rotate accordingly. At this time, the fourth end B' of the second hook 30 no longer resists against the first connecting portion 21, the resilient member 40 drives the second hook 30 to rotate counterclockwise around the second rotating shaft 33, and the third resisting portion 32 no longer protrudes beyond the second fixing side plate 13.

Figure 4:
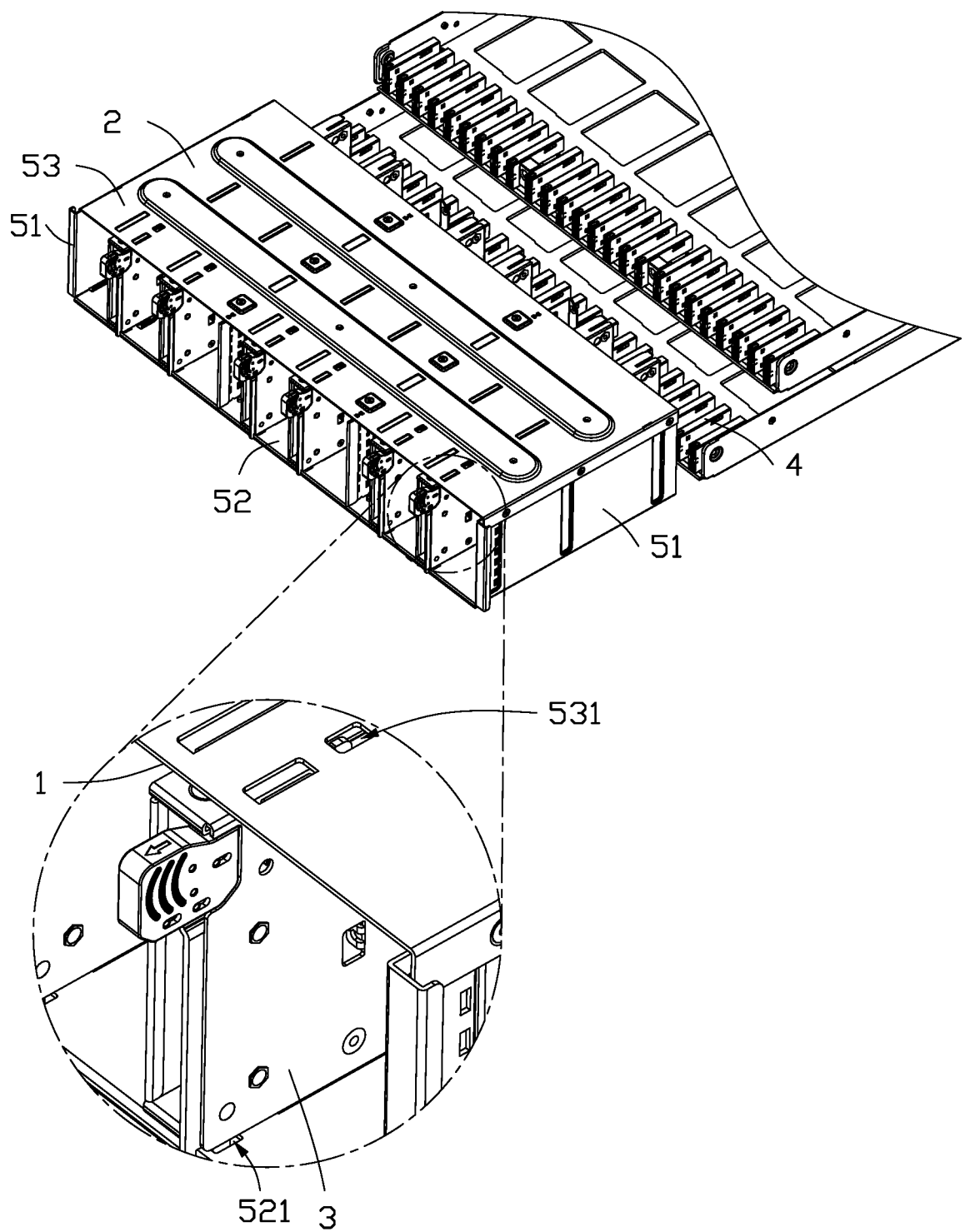
FIG. 4 is an isometric view of an embodiment of an expansion card holder.
Figure 5:
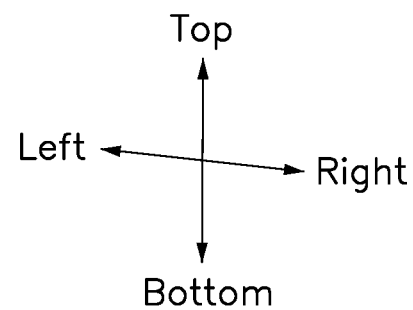
FIG. 5 is an isometric view of a mounting frame of the expansion card holder.
Figure 5:
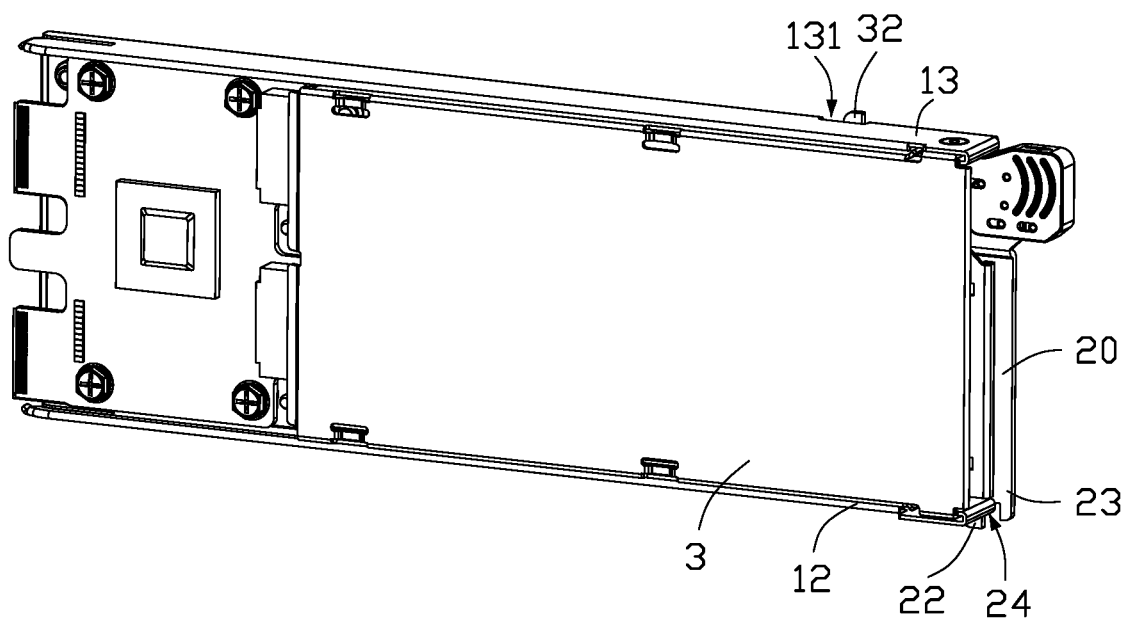
Figure 6:
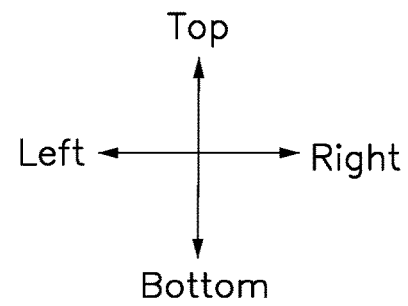
FIG. 6 is a schematic diagram showing an expansion card docking with a connector in the expansion card holder.
Figure 6:
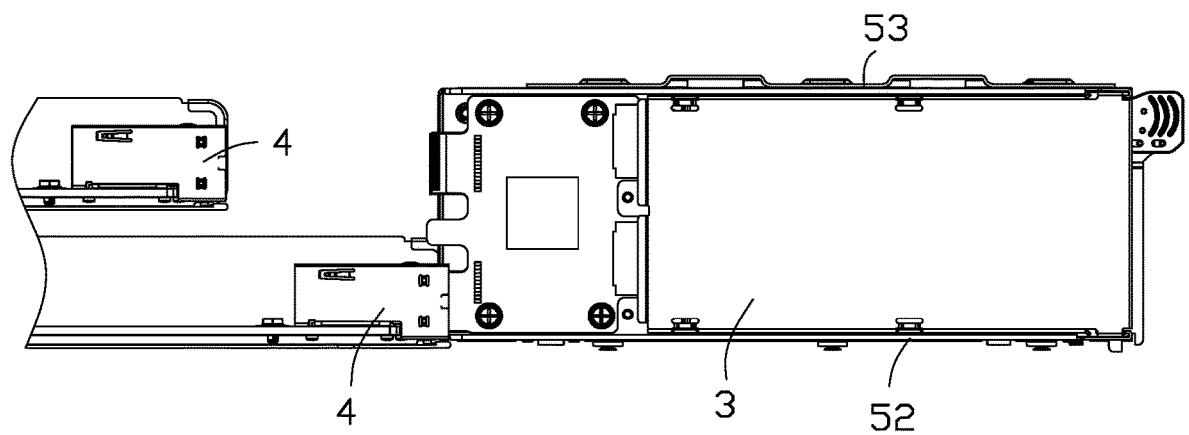

Referring to FIGS. 4, 5, and 6, an embodiment of an expansion card holder 100 is provided. The expansion card holder 100 includes the hook fixing mechanism 1 and a mounting frame 2. An expansion card 3 is accommodated in the hook fixing mechanism 1, and the hook fixing mechanism 1 is accommodated in the mounting frame 2.

A structure of the mounting frame 2 is substantially similar to a structure of the fixing frame 10. Specifically, the mounting frame 2 includes two mounting plates 51, a first mounting side plate 52, and a second mounting side plate 53. The mounting plate 51 is substantially a rectangular parallelepiped plate, and the two mounting plates 51 are parallel to each other. The first mounting side plate 52 and the second mounting side plate 53 are provided on opposite sides of the two mounting plates 51, and the first mounting side plate 52 and the second mounting side plate 53 are perpendicular to the two mounting plates 51, such that the two mounting plates 51, the first mounting side plate 52, and the second mounting side plate 53 cooperatively form a box structure for accommodating the fixing frame 10.

Further, the two mounting plates 51 and the fixing plate 11 are arranged in parallel. The first mounting side plate 52 and the first fixing side plate 12 are arranged in parallel, and the second mounting side plate 53 and the second fixing side plate 13 are arranged in parallel.

The first mounting side plate 52 defines a third through hole 521 at a position corresponding to the first through hole 121 so that the first resisting portion 22 can protrude from the first mounting side plate 52 through the third through hole 521. The second resisting portion 23 is located outside the first mounting side plate 52, and a portion of the first mounting side plate 52 is positioned in the groove 24. Further, the first resisting portion 22 and the second resisting portion 23 resist against a side wall of the third through hole 521, so that the first hook 20 can fix a side of the expansion card 3. The first resisting portion 22 and the second resisting portion 23 can also rotate around the portion of the first mounting side plate 52 located in the groove 24.

The second mounting side plate 53 is provided with a fourth through hole 531 at a position corresponding to the second through hole 131, and the third resisting portion 32 can protrude from the second mounting side plate 53 through the fourth through hole 531. The third resisting portion 32 resists against a side wall of the fourth through hole 531 to fix another side of the expansion card 3 in the mounting frame 2.

In one embodiment, a plurality of the hook fixing mechanisms 1 can be provided in the mounting frame 2 at the same time, so that the mounting frame 2 can simultaneously accommodate a plurality of the expansion cards 3. Each of the expansion cards 3 is docked with a connector 4. The specific number of the hook fixing mechanisms 1 provided in the mounting frame 2 can be set according to actual needs.

The expansion card 3 located in the hook fixing mechanism 1 can be removed from the mounting frame 2 by operating the hook portion 25 to disengage the hook portion 25 from the second positioning post 112. The operation changes of the first hook 20 and the second hook 30 are described above, and will not be repeated here. The first hook 20 and the second hook 30 no longer bear against the mounting frame 2, and the hook fixing mechanism 1 provided with the expansion card 3 can be detached from the mounting frame 2.

It can be understood that the expansion card 3 can be fixed to the hook fixing mechanism 1 by screws or other structures with a fixing effect, and then installed into the mounting frame 2. The expansion card 3 may be a memory or a controller.

Referring to FIG. 6 again, after fixing the expansion card 3 in the expansion card holder 100, when the expansion card 3 is docked with the connector 4, the connector 4 is inserted into the expansion card 3, and upper and lower ends of the expansion card 3 are fixed. Thus, the phenomenon of forward leaning can be avoided.

In summary, after fixing the expansion card 3 in the hook fixing mechanism 1, the hook fixing mechanism 1 is mounted in the mounting frame 2. The first hook 20 and the second hook 30 simultaneously resist against the mounting frame 2, so that when the connector 4 is inserted into the expansion card 3, the expansion card 3 is stably mounted in the mounting frame 2. By adopting the above-mentioned hook fixing mechanism 1 and expansion card holder 100, the expansion card 3 is more stable when docked with the connector 4. Furthermore, the structure of the hook fixing mechanism 1 is simple and easy to use.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A hook fixing mechanism comprising:
    a fixing frame;
    a first hook rotationally mounted on the fixing frame, a first end of the first hook protruding from the fixing frame, and a second end of the first hook buckled on the fixing frame; and
    a second hook rotationally mounted on the fixing frame, a third end of the second hook protruding from the fixing frame, and a fourth end of the second hook resisting against the first hook;
    wherein the fixing frame comprises a fixing plate, the first hook comprises a first connecting portion, the first end of the first hook and the second end of the first hook are opposite ends of the first connecting portion; the first hook comprises a first rotating shaft located substantially at the first end of the first hook, the first rotating shaft is fixed to the first connecting portion and the fixing plate, and the first connecting portion rotates relative to the fixing plate.

2. The hook fixing mechanism of claim 1, wherein:
    the first hook comprises a first resisting portion and a second resisting portion located adjacent to the first end;
    a groove is defined between the first resisting portion and the second resisting portion;
    the fixing frame defines a first through hole;
    the first resisting portion protrudes from the fixing frame through the first through hole;
    the second resisting portion is located outside the fixing frame; and
    a portion of the fixing frame is located in the groove.

3. The hook fixing mechanism of claim 2, wherein:
    the first end is rotationally mounted on the fixing frame;

when the first hook rotates, the first resisting portion and the second resisting portion rotate around the portion of the fixing frame located in the groove.

4. The hook fixing mechanism of claim 3, wherein:
the fixing frame comprises a first positioning post located on a side of the first end to limit rotation of the first end.

5. The hook fixing mechanism of claim 1, wherein:
the second end comprises a hook portion;
the fixing frame comprises a second positioning post; and
the second end of the first hook is buckled on the second positioning post.

6. The hook fixing mechanism of claim 1, wherein:
the second hook comprises a third resisting portion provided at the third end;
the fixing frame defines a second through hole; and
the third resisting portion protrudes from the fixing frame through the second through hole.

7. The hook fixing mechanism of claim 1, further comprising a resilient member; wherein:
two ends of the resilient member are respectively coupled to the fixing frame and the second hook; and
when the second end is disengaged from the fixing frame and the first hook rotates, a restoring force of the resilient member drives the second hook to rotate.

8. The hook fixing mechanism of claim 7, wherein:
the fixing frame further comprises a third positioning post configured to limit rotation of the second hook.

9. An expansion card holder comprising:
a mounting frame; and
a hook fixing mechanism accommodated in the mounting frame, the hook fixing mechanism accommodating an expansion card, the hook fixing mechanism comprising:
a fixing frame;
a first hook rotationally mounted on the fixing frame, a first end of the first hook protruding from the fixing frame, and a second end of the first hook buckled on the fixing frame; and
a second hook rotationally mounted on the fixing frame, a third end of the second hook protruding from the fixing frame, and a fourth end of the second hook resisting against the first hook;
wherein the fixing frame comprises a fixing plate, the first hook comprises a first connecting portion, the first end of the first hook and the second end of the first hook are opposite ends of the first connecting portion; the first hook comprises a first rotating shaft located substantially at the first end of the first hook, the first rotating shaft is fixed to the first connecting portion and the fixing plate, and the first connecting portion rotates relative to the fixing plate.

10. The expansion card holder of claim 9, wherein:
the first hook comprises a first resisting portion and a second resisting portion located adjacent to the first end;
a groove is defined between the first resisting portion and the second resisting portion;
the fixing frame defines a first through hole;
the first resisting portion protrudes from the fixing frame through the first through hole;
the second resisting portion is located outside the fixing frame; and
a portion of the fixing frame is located in the groove.

11. The expansion card holder of claim 10, wherein:
the first end is rotationally mounted on the fixing frame;
when the first hook rotates, the first resisting portion and the second resisting portion rotate around the portion of the fixing frame located in the groove.

12. The expansion card holder of claim 11, wherein:
the fixing frame comprises a first positioning post located on a side of the first end to limit rotation of the first end.

13. The expansion card holder of claim 9, wherein:
the second end comprises a hook portion;
the fixing frame comprises a second positioning post; and
the second end of the first hook is buckled on the second positioning post.

14. The expansion card holder of claim 9, wherein:
the second hook comprises a third resisting portion provided at the third end;
the fixing frame defines a second through hole; and
the third resisting portion protrudes from the fixing frame through the second through hole.

15. The expansion card holder of claim 9, wherein:
the hook fixing mechanism further comprises a resilient member;
two ends of the resilient member are respectively coupled to the fixing frame and the second hook; and
when the second end is disengaged from the fixing frame and the first hook rotates, a restoring force of the resilient member drives the second hook to rotate.

16. The expansion card holder of claim 15, wherein:
the fixing frame further comprises a third positioning post configured to limit rotation of the second hook.

17. The expansion card holder of claim 9, wherein:
the mounting frame defines a third through hole and a fourth through hole;
the first end is located in the third through hole and resists against the mounting frame; and
the third end is located in the fourth through hole and resists against the mounting frame.

* * * * *